United States Patent
Cao et al.

(10) Patent No.: US 10,861,400 B2
(45) Date of Patent: Dec. 8, 2020

(54) DISPLAY DEVICE, ELECTRONIC DEVICE AND DISPLAY CONTROL METHOD FOR SCREEN

(71) Applicant: Mobvoi Information Technology Co., LTD, Beijing (CN)

(72) Inventors: Huanjie Cao, Beijing (CN); Saihuang Peng, Beijing (CN); Fanming Kong, Beijing (CN)

(73) Assignee: Mobvoi Information Technology Co., LTD, Beijing (CN)

(*) Notice: Subject to any disclaimer, the term of this patent is extended or adjusted under 35 U.S.C. 154(b) by 0 days.

(21) Appl. No.: 15/989,030

(22) Filed: May 24, 2018

(65) Prior Publication Data

US 2019/0237029 A1    Aug. 1, 2019

(30) Foreign Application Priority Data

Jan. 26, 2018 (CN) .......................... 2018 1 0077532
Mar. 23, 2018 (WO) ................ PCT/CN2018/080293

(51) Int. Cl.
*G09G 3/36* (2006.01)
*G06F 1/32* (2019.01)
(Continued)

(52) U.S. Cl.
CPC ........... *G09G 3/36* (2013.01); *G02F 1/13338* (2013.01); *G05D 23/20* (2013.01); *G06F 1/32* (2013.01); *H01L 27/3211* (2013.01); *H01L 27/3232* (2013.01); *H01L 27/3244* (2013.01); *G09G 2330/021* (2013.01)

(58) Field of Classification Search
CPC ........ G09G 3/36; G09G 3/32; G02F 1/13338; G05D 23/20; G06F 1/32; H01L 27/3211; H01L 27/3244

See application file for complete search history.

(56) References Cited

U.S. PATENT DOCUMENTS

2003/0201960 A1* 10/2003 Fujieda ............. G02F 1/133603
345/87
2006/0279673 A1* 12/2006 Tanase ............. G02F 1/133603
349/67
(Continued)

FOREIGN PATENT DOCUMENTS

CN       1901003 A     1/2007
CN     101806962 A     8/2010
(Continued)

OTHER PUBLICATIONS

International Search Report Issued in corresponding PCT/CN2018/080293, dated Oct. 23, 2018.

*Primary Examiner* — Alexander Eisen
*Assistant Examiner* — Cory A Almeida
(74) *Attorney, Agent, or Firm* — Andrus Intellectual Property Law, LLP (57) ABSTRACT

The present disclosure relates to a display device. The display device includes: a display module, which comprises at least two layers of display panels; and at least two controllers, which are connected to respective display panels of the at least two layers of display panels of the display module, each controller of the at least two controllers is configured to, in an operating state, control one respective display panel connected to each controller to display.

19 Claims, 6 Drawing Sheets

(51) Int. Cl.
*H01L 27/32* (2006.01)
*G02F 1/1333* (2006.01)
*G05D 23/20* (2006.01)

(56) References Cited

U.S. PATENT DOCUMENTS

| | | | |
|---|---|---|---|
| 2009/0244048 A1* | 10/2009 | Yamanaka | G09G 3/007 345/212 |
| 2012/0033144 A1* | 2/2012 | Kim | G02F 1/13473 349/1 |
| 2012/0105384 A1 | 5/2012 | Clayton | |
| 2014/0281607 A1 | 9/2014 | Tse | |
| 2017/0010735 A1* | 1/2017 | Hu | G09G 3/344 |

FOREIGN PATENT DOCUMENTS

| | | |
|---|---|---|
| CN | 204515588 U | 7/2015 |
| CN | 105449124 | 3/2016 |
| CN | 107515492 A | 12/2017 |
| CN | 107515493 A | 12/2017 |

\* cited by examiner

DISPLAY DEVICE, ELECTRONIC DEVICE AND DISPLAY CONTROL METHOD FOR SCREEN

CROSS REFERENCE TO RELATED APPLICATIONS

This application is based upon and claims the benefit of priority of Chinese patent application No. 201810077532.3 filed on Jan. 26, 2018, the contents of which are incorporated herein by reference in its entirety.

TECHNICAL FIELD

The present disclosure relates to the field of display technology. The present disclosure for example relates to a display device, an electronic device and a display control method for a screen.

BACKGROUND

With the development of the science and technology, display devices are widely used in daily life of people and play an indispensable role. At the same time, with the rapid development of the semiconductor technology, a crucial leap and promotion has been made to the display devices with respect to visual representation.

Most of the display devices are equipped with a one-layer display screen, which has excellent characteristics such as absence of dead angle, high definition, high resolution, wide temperature range and well shock resistance. The relative information of the display device is displayed. Therefore, the visual experience of the user is enhanced and the service life of the display device is extended.

However, in the case of the one-layer display screen, when a failure occurs on the screen or the requirements on display of the user are not satisfied, the user experience of the electronic device containing the display device is unsatisfactory.

SUMMARY

Below is the summary of the subject matter which will be described herein in detail. The summary is not to limit the protection scope of the claims. The present disclosure provides a display device, an electronic device and a display control method for a screen, so as to address the problem of unsatisfactory user experience when a failure occurs on the screen or the requirements on display of the user are not satisfied.

An embodiment provides a display device, which includes: a display module, which includes at least two layers of display panels; and at least two controllers, which are connected to respective display panels of the at least two layers of display panels of the display module, each controller of the at least two controllers is configured to, in an operating state, control one respective display panel connected to the each controller to display.

An embodiment further provides an electronic device, which includes the display device provided by any embodiment.

An embodiment further provides a display control method for a screen, which is applied in the display device provided by any embodiment, the method including:

when a master controller switches from an operating state to a hibernating state, the master controller sends a screen turn-off instruction to a first display panel and triggers a slave controller to switch from the hibernating state to the operating state; and when the master controller switches from the hibernating state to the operating state, the master controller sends a screen turn-on instruction to the first display panel and triggers the slave controller to switch from the operating state to the hibernating state, the slave controller sends the screen turn-on instruction to a second display panel when the slave controller switches from the hibernating state to the operating state, and the slave controller sends the screen turn-off instruction to the second display panel when the slave controller switches from the operating state to the hibernating state.

In the case where a specific display panel cannot display normally or satisfy the requirements on display of the user, according to the embodiments of the present disclosure, at least two controllers are respectively connected to at least two layers of display panels having different power consumption and each controller in an operating state controls one respective display panel connected to this controller to display, so as to enhance the user experience.

Other aspects can be understood will be apparent upon reading and understanding the drawings and the detailed descriptions.

DETAILED DESCRIPTION

Embodiment 1

Figure 1:
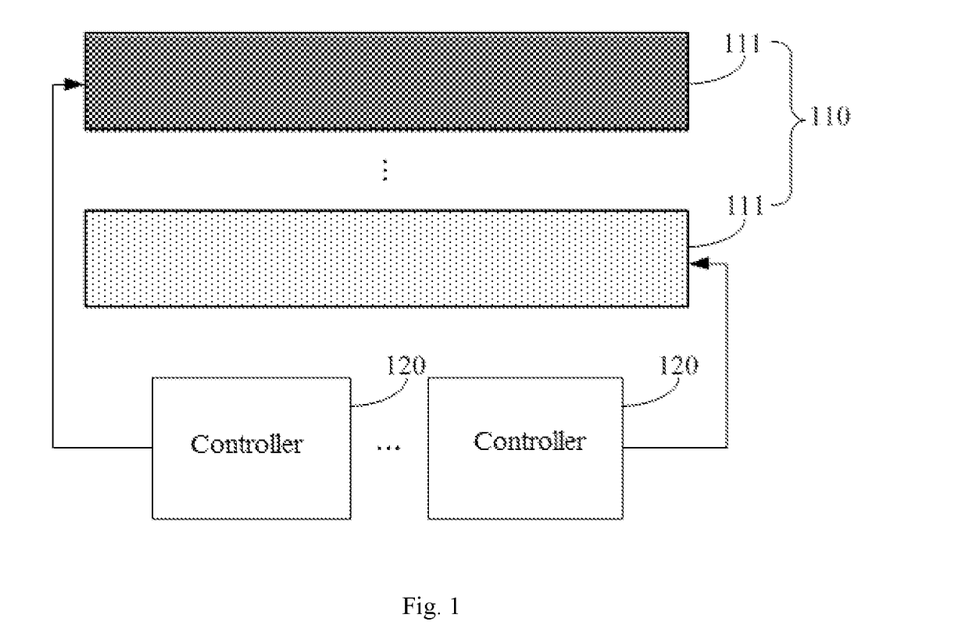
FIG. 1 is a structure diagram of a display device provided by an embodiment 1.

FIG. 1 is a structure diagram of a display device provided by an embodiment 1. The display device includes a display module 110 and at least two controllers 120. The display module 110 includes at least two layers of display panels 111. The at least two controllers 120 are connected to respective display panels of at least two layers of display panels 111 of the display device 110. Each controller of at least two controllers 120 is configured to, in an operating state, control one respective display panel 111 connected to the controller to display.

Different display panels 111 may be combined in a bonding process to form the display module. In addition, after the bonding process, a display panel located on the upper layer is highly transparent. In this way, when a display panel located on the lower layer displays information, the display of the information by the display panel on the lower layer is not affected by the display panel on the upper layer, thereby guarantee the display effect of the display panel on the lower layer.

Controllers 120 and display panels 111 may be connected through a bus.

In practical applications, in the case where a display panel 111 cannot display normally or cannot satisfy the requirements on display of a user, the controllers 120 controls the switching between different display panels for display, so as to enhance the user experience.

On the basis of the solution in the embodiment described above, in an embodiment, different display panels of the at least two layers of display panels 111 of the display module 110 have different power consumptions.

In practical applications, the controllers 120 controls the switch between the display panels 111 of different power consumptions for displaying relative information. As such, on the premise of satisfying the requirements on display of the user, the power consumption of the display device is reduced and the stand-by time of the display device is extended, thereby achieving the effect of reducing power consumption and saving energy.

Figure 2:
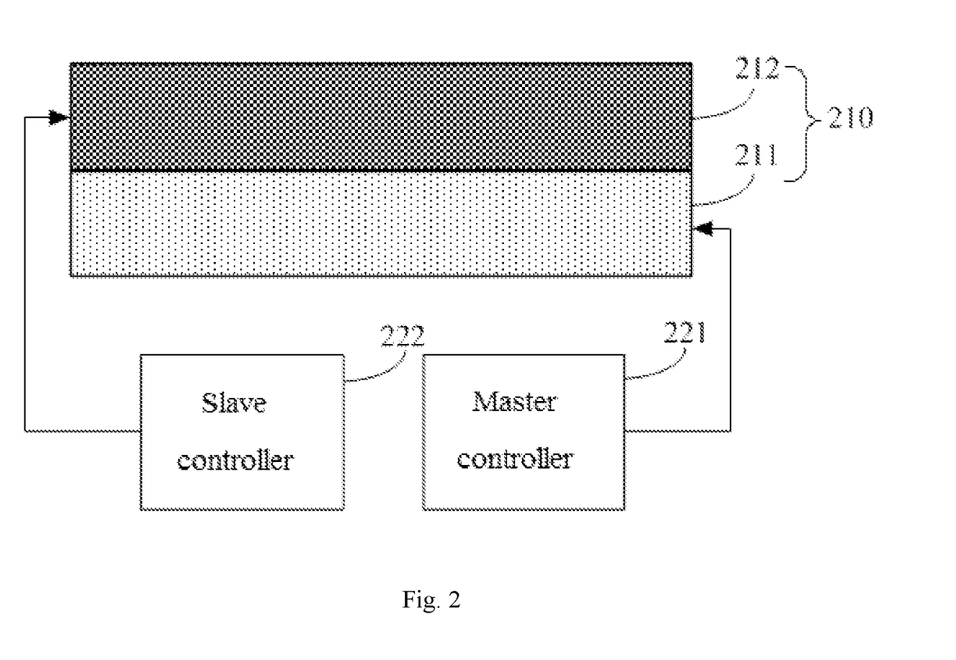
FIG. 2 is a structure diagram of another display device provided by the embodiment 1.

FIG. 2 is a structure diagram of another display device provided by the embodiment 1. In an embodiment, the display module 210 includes a first display panel 211 and a second display panel 212. The light emitting surface of the first display panel 211 faces a surface of the second display panel 212 opposite to the light emitting surface of the second display panel 212. The power consumption of the second display panel 212 is lower than the power consumption of the first display panel 211. The controllers include a master controller 221 and a slave controller 222. The master controller 221 is connected to the first display panel 211. The slave controller 222 is connected to the second display panel 212. The master controller 221 is configured to, in the operating state, control the first display panel 211 to display. The slave controller 222 is configured to, in the operating state, control the second display panel 212 to display. The second display panel 212 is highly transparent, such that the display effect of the first display panel 211 is guaranteed when the first display panel 211 displays.

In practical applications, in the case where the use of the first display panel 211 with higher power consumption for displaying relative information is unnecessary, the slave controller 222 is in the operating state and controls the second display panel 212 to display. In the case of higher requirements on display such as a required resolution higher than a preset value, the master controller 221 is in the operating state and controls the first display panel 211 to display. The use of the display device described above enables that, on the premise of satisfying the requirements on display of the user, the power consumption of the display device is reduced and the stand-by time of the display device is extended, thereby achieving the effect of reducing power consumption and saving energy.

Figure 3:
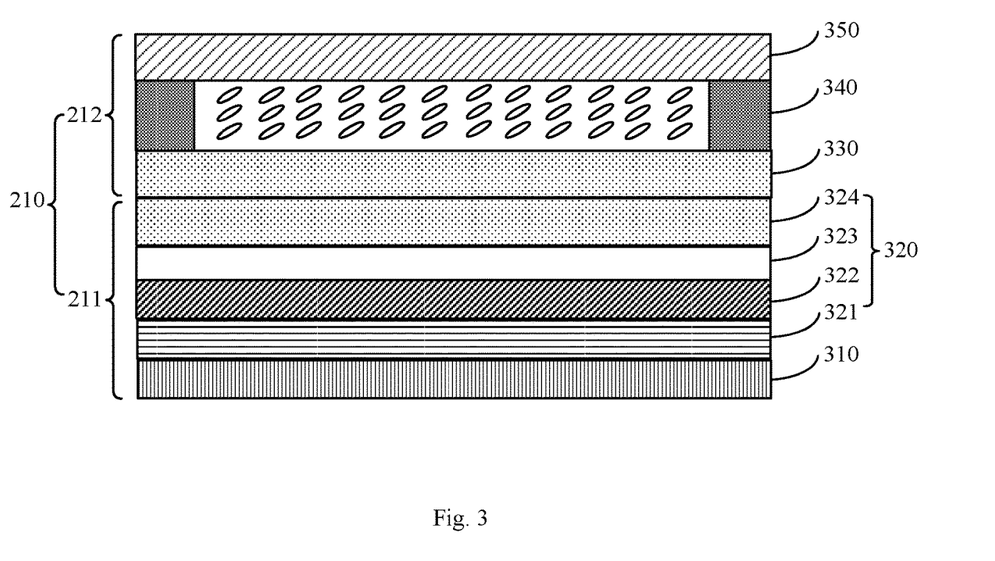
FIG. 3 is a structure diagram of a display module provided by the embodiment 1.

On the basis of the display module of the display device in FIG. 2, in an embodiment, FIG. 3 is a structure diagram of another display module provided by the embodiment 1. The display module 210 includes a first display panel 211 and a second display panel 212.

The first display panel 211 includes an organic light emitting display panel 211. The second display panel 212 includes a liquid crystal display (LCD) panel 212.

The organic light emitting display panel 211 and the LCD panel 212 are independent of each other in the time-division display. The LCD panel 212 may be transparent and does not include a backlight. If the LCD panel 212 has a backlight, the backlight will shield the organic light emitting display panel 211 on the lower layer. Meanwhile, a backlight is necessary for the LCD panel 212 to display normally. In view of the fact that the organic light emitting display panel 211 generally includes a metal layer serving as the metal cathode, the present disclosure proposes to use the metal layer in the organic light emitting display panel 211 as the backlight of the LCD panel 212. This ingenious arrangement can implement the time-division display of two display panels.

In an embodiment, the organic light emitting display panel 211 and the LCD panel 212 may be combined in a bonding process to form the display module.

In an embodiment, the organic light emitting display panel 211 includes: a first substrate 310; organic light emitting structures 320, which are arranged in an array at one side of the first substrate 310, each organic light emitting structure 320 includes a hole transport layer 321, an organic emissive layer 322, an electron transport layer 323 and a metal layer 324 which are stacked in sequence.

The LCD panel 212 is attached to the metal layer 324 of the organic light emitting display panel 211, such that the metal layer 324 serves as the backlight of the LCD panel 212. The ambient light reaches the metal layer 324 and is reflected by the metal layer 324. The ambient light reflected by the metal layer 324 serves as the light source of the LCD panel 212.

In an embodiment, the organic light emitting structures 320 include at least one red organic light emitting structure, at least one green organic light emitting structure and at least one blue organic light emitting structure. The red organic light emitting structure emits red light. The green organic light emitting structure emits green light. The blue organic light emitting structure emits blue light.

In an embodiment, since the red organic light emitting structure, the green organic light emitting structure and the blue organic light emitting structure may be powered to different luminance levels and with different combinations (e.g., one organic light emitting structure is powered, or two organic light emitting structures are powered, or all organic light emitting structures are powered), the organic light emitting structure 320 represents various colors. The light emitting of the organic light emitting structure 320 is an injected light emitting. Briefly, electrons injected from the cathode and holes injected from the anode interact on the emissive layer and form excitons. The excitons return from an excited state to a ground state, the energy difference between the excited state and the ground state is released in the form of photons.

In an embodiment, the organic light emitting display panel 110 may include an active-matrix organic light emitting diode (AMOLED) panel.

The AMOLED is made of organic illuminants. Thousands of illuminants are disposed on the substrate of the screen in a specific manner. Each illuminant emits light of one color selected from red, green and blue. When a voltage is applied on an illuminant, the illuminant emits red light, or green light, or blue light. The change of the voltage is also performed by means of a thin film transistor (TFT). The portions of three primary colors are adjusted to form various colors.

The OLED, i.e., organic light emitting diode (also referred as organic electroluminescent device), has a basic structure including an anode, a cathode and an emissive layer which correspond to each pixel region. When the voltage is applied on the anode and the cathode, holes moves through the hole transport layer to the emissive layer and electrons moves through the electron transport layer to the emissive layer. The holes and the electrons recombine in the emissive layer. The excitons in the emissive material moves from the excited state to the ground state. The organic light emitting structures of different colors have emissive layers made of different emissive materials. The emissive material corresponding to the respective organic light emitting structures of different colors emit light of different colors under the voltages applied on the anodes and the cathodes.

In the related art, a number of mature AMOLED products exist. In these products, a layer of circular polarizer is usually attached to the upper side of the metal layer in the AMOLED product, so as to filter out noise and improve the contrast ratio of the AMOLED product. Therefore, in order to reduce the procedure for implementing the embodiment and reduce the cost of development, in the embodiment, the organic light emitting display panel 211 of the embodiment may be formed by removing the circular polarizer from an existing AMOLED product.

In one embodiment, requirements may be elicited when purchasing AMOLED screens of a manufacturer, such that the manufacturer removes the process of attachment of the circular polarizer during the production process, so as to directly obtain the AMOLED screens without the circular polarizer, i.e., the organic light emitting display panel 211. In the embodiment, the organic light emitting display panel 211 consisting of AMOLEDs may display in colors, and the LCD panel 212 may display in black and white. For example, in the case of the display of time and date, the LCD panel 212 is used to display; in the case of the display of a WeChat message, the organic light emitting display panel 211 is used to display.

Those skilled in the art understands through experiments that, the use of the LCD panel 212 to display contents, which do not need to be displayed in colors, can minimize power consumption and save most energy. For example, as for an electronic device (e.g., smartwatch or smart bracelet) containing a display device and having a small battery capacity and short battery life, the display module 210 described above may play a more important role.

In general, the cost of the LCD panel 212 is low. The present embodiment introduces the LCD panel 212 to substantially reduce the power consumption of the device without significantly increasing the cost of production, thereby apparently improving the user experience and product competitiveness.

In an embodiment, the LCD panel 212 includes a second substrate 330, a crystal layer 340 and a third substrate 350, the second substrate 330 is attached to the metal layer 324 of the organic light emitting display panel, the second substrate 330 and the third substrate 350 are transparent.

With the arrangement describe above, the LCD panel 212 is a transparent panel. As such, when the organic light emitting display panel 211 on the lower layer operates, the LCD panel 212 has a minimal effect on the organic light emitting display panel 211. Although part of the contrast ratio and the degree of saturation of the organic light emitting display panel 211 is sacrificed, the sacrificed part may be compensated using software.

The LCD panel 212 may include a film compensation super twisted nematic (FSTN) panel.

Such LCD display panel 212 is covered by a layer of compensation film. The compensation film is usually made of polymer and is birefringent. When a ray of ordinary light and a ray of extraordinary light pass thought the compensation film, an additional phase difference is generated. The additional phase difference delays or compensates the phase of the ordinary light and the phase of the extraordinary light, so as to change the inference color of the polarized light. The compensation film of the FSTN may be located either under the polarizer or on the polarizer. There may be one compensation film or two compensation films. In some cases, the lower compensation film of a system of two compensation films may also serve as a collimator, and the upper compensation film also serves as a scattering film, such that the view angle of the LCD is increased without increasing the response time of the LCD.

The FSTN panel is a super twisted nematic (STN) panel with a thin compensation film and is capable of displaying in black and white. The FSTN panel has restrict requirements on the delay and orientation of the thin polymeric film. For the relationship between the contrast ratio and the view angle, the view angle and contrast ratio of a STN panel in a black-white mode is much better than those of the STN panel in a yellow-green mode. The contour lines representing a contrast ratio greater than 5 covers a broader region, and the contour lines representing a contrast ratio greater than 10 also covers a region broader than that of the STN panel in the yellow-green mode.

Figure 4:
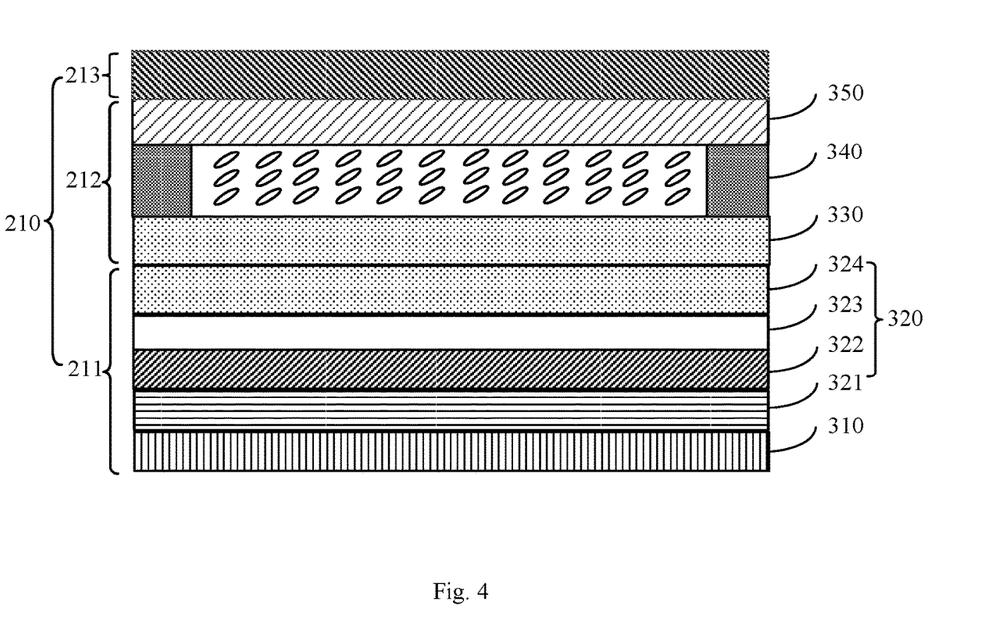
FIG. 4 is a structure diagram of another display module provided by the embodiment 1.

On the basis of the display module in FIG. 3, in an embodiment, FIG. 4 is a structure diagram of another display module provided by the embodiment 1. The display module 210 further includes a transparent glass 213. The transparent glass 213 is arranged on the side of the light emitting surface of the second display panel 212.

The transparent glass 213 arranged in the display module 210 protects the first display panel 211 and the second display panel 212 of the display device.

Figure 5:
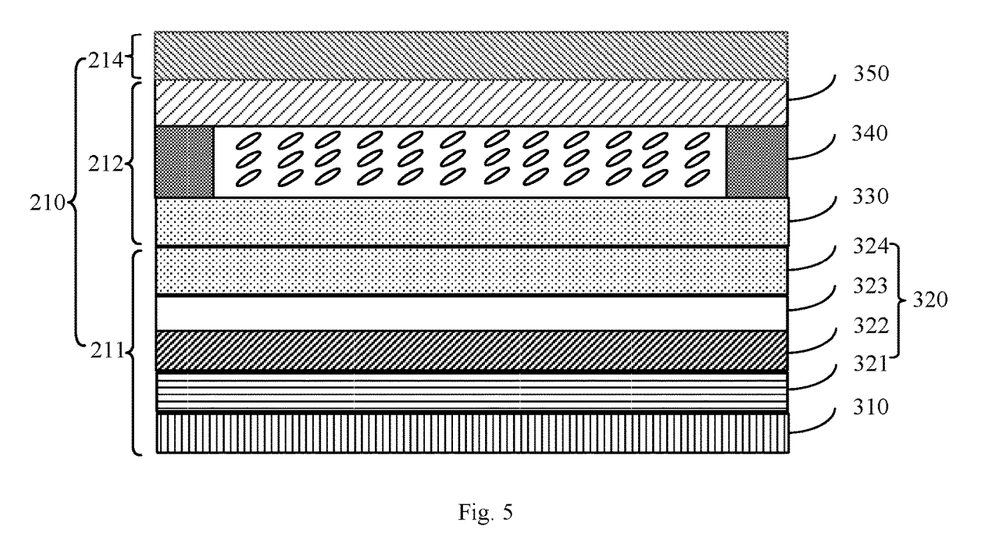
FIG. 5 is a structure diagram of another display module provided by the embodiment 1.

On the basis of the display module in FIG. 3, in an embodiment, FIG. 5 is a structure diagram of another display module provided by the embodiment 1. The display module 210 further includes a touch screen 214. The touch screen 214 is arranged on the side of the light emitting surface of the second display panel 212. The display panel 214 is connected to the master controller (not shown), the touch screen 214 is used to acquire touch-position information and send the touch-position information to the master controller.

The touch screen 214 arranged in the display module 210 enables the interaction between the user and the display device, and enables the user to operate the display device more conveniently.

Figure 6:
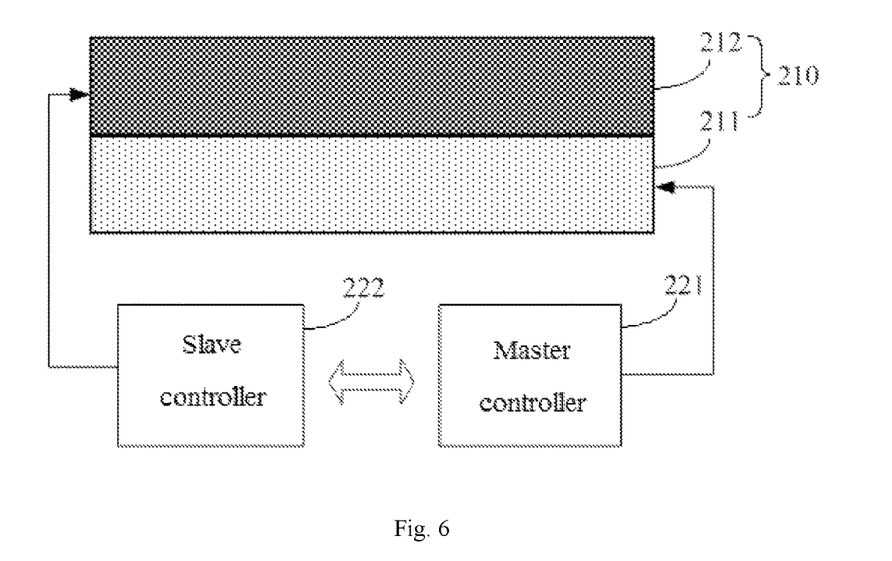
FIG. 6 is a structure diagram of another display module provided by the embodiment 1.

On the basis of the display device in FIG. 2, in an embodiment, FIG. 6 is a structure diagram of another display device provided by the embodiment 1. In the display device, the master controller 221 is connected to the slave controller 222, the master controller 221 is configured to trigger the slave controller 222 to enter the operating state when the master controller 221 switches from the operating state to a hibernating state, and to trigger the slave controller 222 to enter the hibernating state when the master controller 221 switches from the hibernating state to the operating state.

In an embodiment, a communication connection is established between the master controller 221 and the slave controller 222. When it is unnecessary to use the first display panel 211 with high power consumption to display, the master controller 221 switches from the operating state to the hibernating state and triggers the slave controller 222 to switch from the hibernating state to the operating state. At this time, the second display panel 212 displays and the first display panel 211 does not display. When the display effect of the second display panel 212 cannot reach the requirements on display, the master controller 221 switches from the hibernating state to the operating state and triggers the slave controller 222 to switch from the operating state to the hibernating state. At this time, the first display panel 211 displays and the second display panel 212 does not display.

In practical applications, the master controller 221 directly or indirectly controls the first display panel 211 and the second display panel 212 to display or not. Therefore, on the premise of satisfying the requirements on display of the user, the power consumption of the display device is reduced and the stand-by time of the display device is extended, thereby achieving the effect of reducing power consumption and saving energy.

In an embodiment, a master operating system runs on the master controller 221 and a slave operating system runs on the slave controller 222. The power consumption of the slave operating system is lower than the power consumption of the master operating system.

In an embodiment, the master operating system is Android OS and the slave operating system is a real time operating system (RTOS). The power consumption of the RTOS is lower than the power consumption of the Android OS.

In practical applications, the Android OS running on the master controller controls the master controller 221 to switch between the operating state and the hibernating state, and to, in the operating state, control the first display panel 211 to display relative information of the display device. The master controller 221 is further configured to trigger the slave controller 222, so as to control the slave controller 222 to switch between the operating state and the hibernating state. When the slave controller 222 is in the operating state, the RTOS running on the slave controller 222 controls the second display panel 212 to display the relative information of the display device.

When it is unnecessary to user the first display panel 211 with high power consumption to display the relative information of the display device, the use of the second display panel 212 with low power consumption for displaying the relative information of the display device can reduce the power consumption of the display device. In addition, since the RTOS, which has a power consumption lower than that of the Android OS, controls the second display panel 212 to process corresponding data and display the relative information of the display device, the power consumption of the display device is further reduced and the stand-by time of the display device is further extended, thereby achieving the effect of reducing power consumption and saving energy.

In an embodiment, the display device is a smartwatch or a smart bracelet.

Embodiment 2

Figure 7:
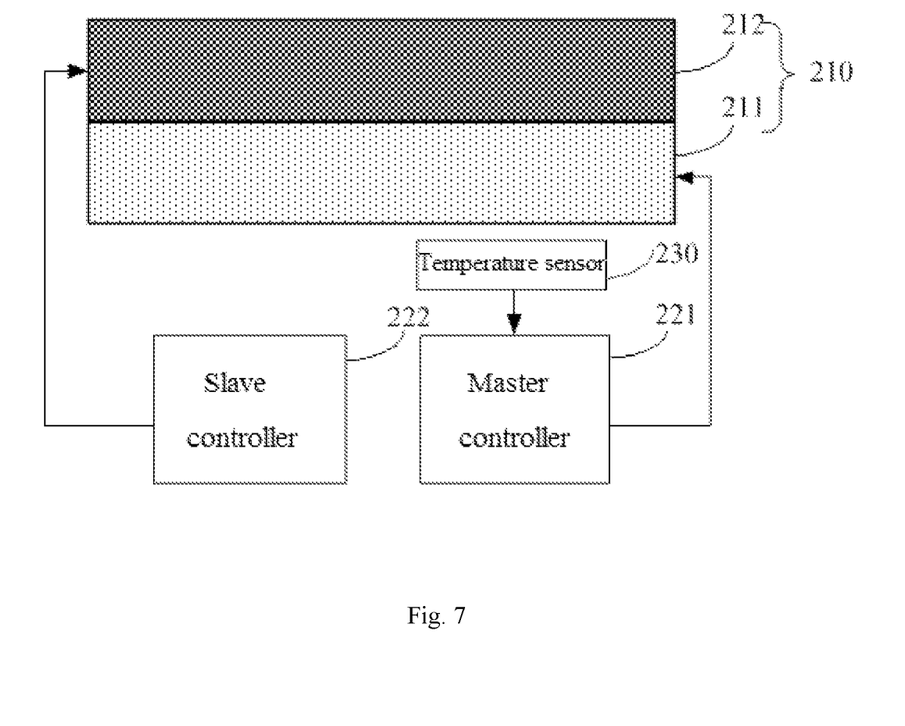
FIG. 7 is a structure diagram of a display device provided by an embodiment 2.

FIG. 7 is a structure diagram of a display device provided by an embodiment 2. On the basis of the solution of the embodiments described above, the display device further includes a temperature sensor 230, the temperature sensor 230 is connected to the master controller 221, the temperature sensor 230 is used to detect the environmental temperature of the environment and send the environmental temperature to the master controller 221, the master controller 221 cooperates with the slave controller 222 to control the time-division display of the first display panel 211 and the second display panel 212 based on the environmental temperature.

In practical applications, if the environmental temperature of the environment of the display device is too high, the display module 210 consisting of the first display panel 211 and the second display panel 212 has a short response time. As such, the switch between the first display panel 211 and the second display panel 212 leads to a case of blank screen where both the first display panel 211 and the second display panel 212 do not display (i.e., one has been turned off and the other has not been turned on). On the contrary, if the environmental temperature of the environment of the display device is too low, the display module 210 consisting of the first display panel 211 and the second display panel 212 has a long response time. As such, the switch between the first display panel 211 and the second display panel 212 leads to a case of ghosting where both of the first display panel 211 and the second display panel 212 display at the same time (i.e., one display panel has the displayed content unfaded and the other display panel has been turned on).

Therefore, on the basis of the solution of the embodiments described above, a temperature sensor 230 is added to detect the environmental temperature of the environment of the display device. The master controller 221 receives the environmental temperature detected by the temperature sensor 230 and cooperates with the slave controller 222 to control the time-division display of the first display panel 211 and the second display panel 212.

The temperature sensor 230 may be arranged close to an outermost display panel, so as to enhance the confidence level in the detection of environmental temperature of the environment of the display device.

In an embodiment, the master controller 221 acquires the environmental temperature detected by the temperature sensor 230. When the display device is in an environment of high temperature, the switch time is shortened based on the correspondence between the environmental temperature and the switch time between two display panels. As such, the case of blank screen where one display panel has been turned off and the other display panel has not been turned on is avoided. When the display device is in an environment of low temperature, the switch time is extended based on the correspondence between the environmental temperature and the switch time between two display panels. As such, the case of ghosting where one display panel has the displayed content unfaded and the other display panel has been turned on is avoided.

In an embodiment, the display device is a smartwatch or a smart bracelet.

Embodiment 3

The present embodiment further provides an electronic device, which includes the display device according to any embodiment described above.

Embodiment 4

Figure 8:
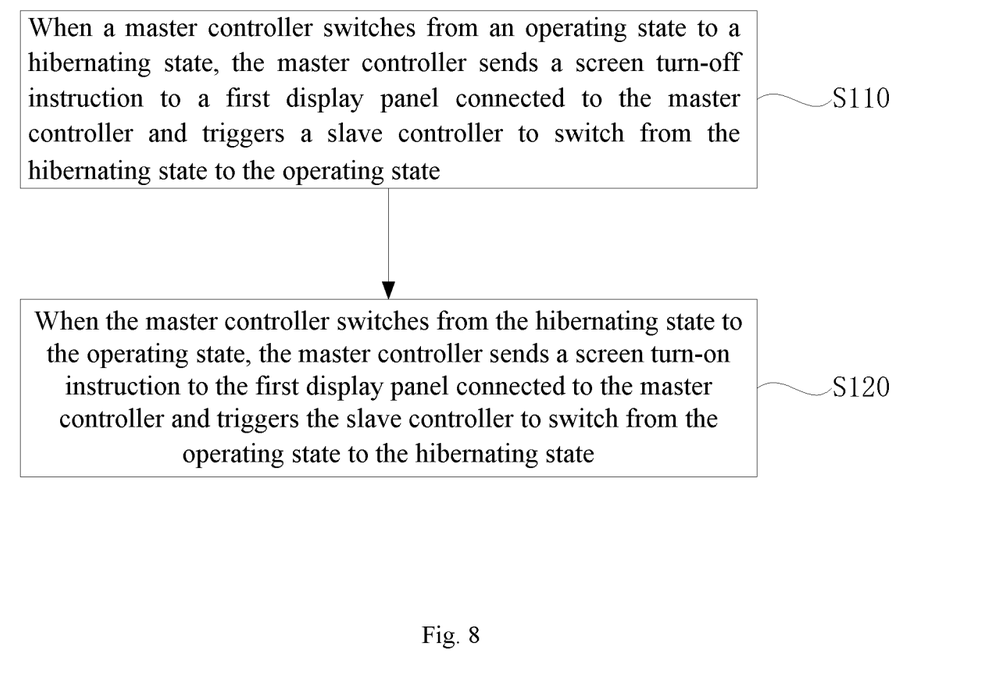
FIG. 8 is a flow chart of a display control method for a screen provided by an embodiment 4.

FIG. 8 is a flow chart of a display control method for screen provided by an embodiment 4. The embodiment is adapted to the case of time-division display of the display device provided by any embodiment. The method may be implemented by a display control device for screen. The display control device for screen is embodied by software, hardware or the combination thereof, and is arranged in the electronic device including the display device provided by any embodiment. For example, the electronic device may be a wearable device such as smartwatch or smart bracelet. The method includes step S110 and step S120 described below.

In step S110, when a master controller switches from an operating state to a hibernating state, the master controller sends a screen turn-off instruction to a first display panel connected to the master controller and triggers a slave controller to switch from the hibernating state to the operating state.

In step S120, when the master controller switches from the hibernating state to the operating state, the master controller sends a screen turn-on instruction to the first display panel connected to the master controller and triggers the slave controller to switch from the operating state to the hibernating state.

When the slave controller switches from the hibernating state to the operating state, the slave controller sends a screen turn-on instruction to a second display panel connected to the slave controller. When the slave controller switches from the operating state to the hibernating state, the slave controller sends a screen turn-off instruction to the second display panel connected to the slave controller.

In the present embodiment, since the master controller and the slave controller respectively control the first display panel and the second display panel to switch between the operating state and the hibernating state, when one display panel fails and cannot display normally, the switch from the failed display panel to the other display panel guarantees the normal operation of the display device, so as to enhance the user experience.

A number of devices use organic display panels as their display screens. Organic light emitting diodes are widely used in display devices of electronic devices for their small size and well display effect in colors. In particular, the OLED display screen is a preferred option for the wearable device. However, a device which uses only the OLED display screen has an enhanced system power consumption. In the use of smart terminals, in some application scenarios, a small amount of information needs to be displayed. In an exemplary embodiment, when a user wears a wearable device and participate in outdoor sports, only relative information such as time, date or the number of steps needs to be displayed, and other information is not required. If the OLED display screen is used all the time, it will cause unnecessary power consumption. Furthermore, if there is no place to recharge the device, the use of the wearable device by the user may be affected. In order to address this problem, the present embodiment uses a dual screen consisting of the LCD panel and the organic light emitting display panel. In other words, a TN panel is disposed on the OLED panel. The TN panel is a basic LCD panel having a low cost and widespread application and is widely used in popular mid-to-low end LCDs in the market. After improvement, a film (i.e., compensation film) is added on the TN panel to compensate the small view angle of the TN panel. The existing improved TN panel may have a view angle up to 160°. This is of course an extreme value detected by the manufacturer under a contrast ratio of 10:1. In fact, when the contrast ratio decreases to 100:1, distortion and even color cast occur in the image. Since the TN panel has a low cost, such dual screen has a relatively high cost performance. Optionally, a film compensation super twisted nematic (FSTN) display panel (i.e., FSTN LCD screen) and an active-matrix organic light emitting diode (AMOLED) screen are used. Since the AMOLED is self-luminous, flexible, extreme thin and has a wide color gamut, the AMOLED has particular advantage when applied in the wearable device.

The steps of the display control method for screen will be described below in detail with reference to the structure diagrams of the display device and the display module provided in the embodiments described above.

When a display device is used, a user may select a display panel to display according his requirements. The processing system of the display device may also switch between display panels according actual requirements. When it is unnecessary to use the first display panel 211 with high power consumption to display relative information of the display device, the master controller 221 switches from the operating state to the hibernating state. At the same time, the master controller 221 sends a screen turn-off instruction to the first display panel 211 and triggers the slave controller 222 to switch from the hibernating state to the operating state. Correspondingly, the slave controller 222 sends a screen turn-on instruction to the second display panel 212 connected to the slave controller 222, and the second display panel 212 displays the relative information of the display device.

When the display effect of the second display panel 212 with low power consumption cannot satisfy the requirements of the user, the master controller 221 switches from the hibernating state to the operating state. At the same time, the master controller 221 sends a screen turn-on instruction to the first display panel 211 and triggers the slave controller 222 to switch from the operating state to the hibernating state. Correspondingly, the slave controller 222 sends a screen turn-off instruction to the second display panel, and the first display panel 211 displays the relative information of the display device.

It should be understood that, when the display device is powered and operates normally, the master controller 221 and the slave controller 222 are respectively in the operating state and the hibernating state, alternatively. In other words, when the master controller 221 is in the operating state, the slave controller 222 is in the hibernating state; and when the master controller 221 is in the hibernating state, the slave controller 222 is in the operating state. There is a definite division of work between the master controller 221 and the slave controller 222, that is, the master controller 221 and the slave controller 222 alternatively controls the system of the display device, avoiding the occurrence of chaos in the display by the display device.

In the embodiment, the execution sequence of the steps S110 and S120 is not limited. The step S110 may be executed before or after the step 120.

When the master controller 221 switches from the operating state to the hibernating state, the requirement for the use of the second display panel 212 with low power consumption is thus satisfied. In an example, the second display panel 212 is the LCD panel. Since the LCD panel may display with a lowered power consumption, the LCD panel may be used in the case of no need to display too much contents. Optionally, the trigger condition for the master controller 221 to switch from the operating state to the hibernating state may be any of the followings: an operation instruction inputted by the user is detected to use the second display panel 212, the display device is detected to be in a sport mode or a charging mode, the display device is detected to have a light intensity equal to or greater than a preset intensity threshold, and the display device is detected to has a stand-by time greater than a preset time threshold.

The trigger condition for the master controller 221 to switch from the hibernating state to the operating state may be any of the followings: an operation instruction inputted by the user is detected to use the first display panel 211 (for example, the first display panel may be an organic display panel), and a user trigger event is detected to have a complexity greater than a preset complexity threshold. The input operation of the user may be a motion gesture inputted by the user, such as lifting a wrist, shaking an arm. The different numbers of the motion gestures may have different definitions. For example, shaking the arm once means that the user wants to user the LCD panel 212 as the display screen, and shaking the arm twice means that the user wants to user the organic display panel 211 as the display screen. The user may also input the instruction through a mechanical key of the display device. For example, the user may user the crown of the smartwatch to input the instruction. The switch of the screen may also be performed according to the mode of the display device. For example, when the smartwatch is in the sport mode or the charging mode, if the user does not need to view the applications, the smartwatch may switch to the LCD panel 212 to display.

In addition, the TN panel has the characteristic that the contrast ratio of the displayed image increases as the light intensity increases. In other words, when the TN panel displays in black and white, the displayed image is clearer. When the light intensity of the environmental light is large, the brightness of the OLED panel need to be adjusted to a large value, which will increase a large power consumption. Therefore, when the light intensity is high, the TN panel is used to display. The trigger condition for the master controller 221 to switch from the operating state to the hibernating state may be the fact that the light intensity exceeds a preset intensity threshold. The preset intensity threshold may be adjusted according to the attribute of the display panels, or may be set according to actual requirements. The trigger condition for the master controller 221 to switch from the hibernating state to the operating state may be the fact that the complexity of the user trigger event exceeds the preset complexity threshold.

In addition, all possible trigger events may be evaluated in advance with respect to the complexity. The complexity is determined according to the complexity of the image to be displayed. The trigger events may include viewing time, listening to a music or broadcast, running an application, etc. The events such as "viewing time" and "viewing whether" are defined to be events with low complexity. The events such as "running an application" are defined to be events with high complexity. When the complexity of an event exceeds the preset complexity threshold, the event has higher requirements on the display. For example, it is necessary to user the OLED panel to display in the case where the user runs the WeChat on the smartwatch.

The OLED panel may serve as the first display panel 211, and the TN penal may serves as the second display panel 212.

In the embodiment, when the master controller switches from the operating state to the hibernating state, the master controller sends the screen turn-off instruction to the first display panel and triggers the slave controller to switch from the hibernating state to the operating state. The slave controller controls the second display panel to be turned on. When the master controller switches from the hibernating state to the operating state, the master controller sends the screen turn-on instruction to the first display panel and triggers the slave controller to switch from the operating state to the hibernating state. The slave controller controls the second display panel to be turned off. This solution addresses the problem of high power consumption and short stand-by time of the display device. Therefore, on the premise of satisfying the requirements on display, the stand-by time of the display device is extended, achieving the effect of reducing power consumption and saving energy. Moreover, the user can select the panel to display according to the intention, such that the user experience is improved and the actual requirements of the user is better satisfied by the product.

On the basis of the solution of the embodiments described above, in an embodiment, after the master controller 221 triggers the slave controller to enter the operating state, the master controller 221 sends basic information to be displayed to the slave controller 222; the basic information to be displayed is information to be displayed by the second display panel 212 in the control of the slave controller 222 after the slave controller 222 enters the operating state, the basic information to be displayed includes at least one of the followings: system time, system date, data on vital signs. The data on vital signs may be steps, heart rate, etc.

On the basis of the solution of the embodiments described above, in an embodiment, if touch-position information sent by a touch screen 214 is received by the master controller 221 in the hibernating state, the master controller 221 switches from the hibernating state to the operating state.

When the master controller 221 is in the hibernating state, if the user touches the touch screen 214 of the display device, the master controller 221 of the display device receives the touch-position information from the touch screen 214. At this time, the master controller 221 needs to perform operations such as locating the touch. Therefore, the master controller 221 connected to the touch screen 214 switches from the hibernating state to the operating state.

Embodiment 5

Figure 9:
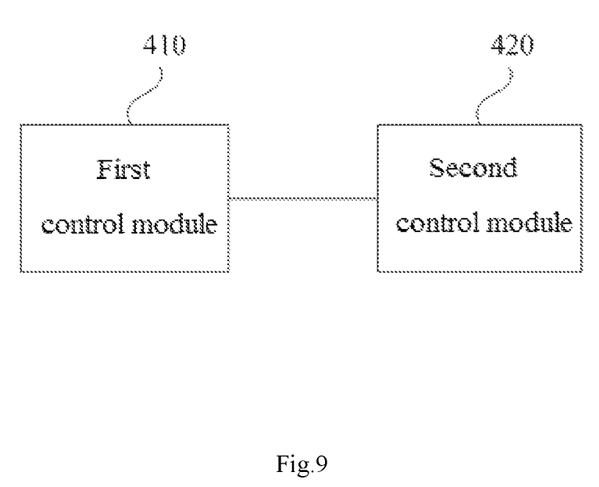
FIG. 9 is a structure diagram of a display control device for a screen provided by an embodiment 5.

FIG. 9 is a structure diagram of a display control device for screen provided by an embodiment 5. The embodiment is adapted to the case of time-division display of the display device provided by any embodiment. The display control device for screen includes a first control module 410 and a second control module 420.

The first control module 410 is configured to, when the master controller switches from the operating state to the hibernating state, sends a screen turn-off instruction to the first display panel connected to the master controller, and triggers the slave controller to switch from the hibernating state to the operating state.

The first control module 410 is also configured to, when the master controller switches from the hibernating state to the operating state, sends a screen turn-on instruction to the second display panel connected to the master controller, and triggers the slave controller to switch from the operating state to the hibernating state.

The second control module 420 is configured to send a screen turn-on instruction to the second display panel connected to the slave controller when the slave controller switches from the hibernating state to the operating state and to send a screen turn-off instruction to the second display panel connected to the slave controller when the slave controller switches from the operating state to the hibernating state.

In the embodiment, when the master controller switches from the operating state to the hibernating state, the master controller uses the first control module to send a screen turn-off instruction to the first display panel connected to the master controller and to trigger the slave controller to switch from the hibernating state to the operating state. The slave controller uses the second control module to send a screen turn-on instruction to the second display panel connected to the slave controller. On the contrary, when the master controller switches from the hibernating state to the operating state, the master controller uses the first control module to send a screen turn-on instruction to the first display panel connected to the master controller and to trigger the slave controller to switch from the operating state to the hibernating state. The slave controller uses the second control module to send a screen turn-off instruction to the second display panel connected to the slave controller.

Through the solution described above, in the case where one display panel of the display device fails to display normally or fails to satisfy the requirements on display of the user, the first control module and the second control module may be used to respectively control the first display panel and the second display panel to perform time-division display, improving the user experience.

On the basis of the solution of the embodiments described above, in an embodiment, the power consumption of the second display panel is lower than the power consumption of the first display panel.

In the embodiment, when the master controller switches from the operating state to the hibernating state, the first control module sends a screen turn-off instruction to the first display panel and triggers the slave controller to switch from the hibernating state to the operating state. The second controller module sends a screen turn-on instruction to the second display panel to control the second display panel to display. On the contrary, when the master controller switches from the hibernating state to the operating state, the first control module sends a screen turn-on instruction to the first display panel and triggers the slave controller to switch from the operating state to the hibernating state. The second control module sends a screen turn-off instruction to the second display panel to control the second display panel to be turned off. This solution solves the problem of high power consumption and short stand-by time of the display device. Therefore, on the premise of satisfying the requirements on display, the stand-by time of the display device is extended, thereby achieving the effect of reducing power consumption and saving energy. Moreover, the user can select the panel to display according to the intention, such that the user experience is improved and the actual requirements of the user is better satisfied by the product.

On the basis of the solution of the embodiments described above, in an embodiment, the display control device for screen further includes: a sending module, which sends the basic information to be displayed to the slave controller; the basic information to be displayed is information to be displayed by the second display panel in the control of the slave controller after the slave controller enters the operating state, the basic information to be displayed includes at least one of the followings: system time, system date, data on vital signs.

On the basis of the solution of the embodiments described above, in an embodiment, the first control module 410 is further configured to switch from the hibernating state to the operating state when the master in the hibernating state receives touch-position information from the touch screen.

The first control module 410 and the sending module correspond to the master controller, while the second control module 420 corresponds to the slave controller.

The display control method for screen described above is capable of implementing the display control method for screen provided by any embodiment, has function modules corresponding to the functions of the display control method for screen, and achieves the effects corresponding to the functions of the display control method for screen.

Embodiment 6

The present embodiment further provides a computer readable storage medium, on which a computer program is stored. The computer program, when executed by the display control device for screen, implements the display control device provided by the embodiment. The method includes: when a master controller switches from an operating state to a hibernating state, the master controller sends a screen turn-off instruction to a first display panel connected to the master controller and triggers a slave controller to switch from the hibernating state to the operating state; when the master controller switches from the hibernating state to the operating state, the master controller sends a screen turn-on instruction to the first display panel connected to the master controller and triggers the slave controller to switch from the operating state to the hibernating state; when the slave controller switches from the hibernating state to the operating state, the slave controller sends a screen turn-on instruction to a second display panel connected to the slave controller, and when the slave controller switches from the operating state to the hibernating state, the slave controller sends a screen turn-off instruction to the second display panel connected to the slave controller.

On the basis of the described implementations above, those skilled in the art can clearly understand that, the embodiment may be implemented in the form of software and necessary general-purpose hardware, or in the form of hardware. Based on this understanding, the solution of the present embodiment may be embodied in the form of a software product, which may be stored in a computer readable storage medium, such as floppy disk, read-only memory (ROM), random access memory (RAM), flash disk, hard disk or compact disk (CD) of a computer. The computer program includes a number of instructions, which enables a computing device (e.g., personal computer, terminal, or network device) to implement the method provided by the embodiments.

INDUSTRIAL APPLICABILITY

The present disclosure provides a display device. The display device uses at least two controllers in respective operating states to control the display panels connected to the respective controllers, enhancing the user experience.

We claim:
1. A display device, comprising:
a display module, which comprises at least two display panels; and
at least two controllers, each of which is connected to a respective one of the at least two display panels and configured to, in an operating state, control the respective one of the at least two display panels to display,
wherein the at least two display panels comprise an organic light emitting display panel and a liquid crystal display (LCD) panel, the LCD panel has a light emitting surface and a back surface opposite to the light emitting surface, the organic light emitting display panel has a light emitting surface facing the back surface of the LCD panel,
wherein the organic light emitting display panel comprises a first substrate and organic light emitting structures on the first substrate, and each of the organic light emitting structures comprises a hole transport layer, an organic emissive layer, an electron transport layer and a metal layer,
wherein the LCD panel comprises a second substrate, a crystal layer and a third substrate, and the metal layer of the organic light emitting display panel is between the crystal layer and the organic emissive layer, wherein ambient light passing through the LCD panel is reflected back to the LCD panel by the metal layer when the LCD is displaying, wherein the at least two controllers comprise a master controller and a slave controller, and the display device further comprises a temperature sensor connected to the master controller, wherein the temperature sensor is used to detect an environmental temperature and send the environmental temperature to the master controller, and the master controller cooperates with the slave controller to control the time-division display of the organic light emitting display panel and the LCD panel based on the environmental temperature, wherein a switch time between the organic light emitting display panel and the LCD panel at a higher environmental temperature is shorter than a switch time between the organic light emitting display panel and the LCD panel at a lower environmental temperature.

2. The display device according to claim 1, wherein the power consumption of the LCD panel is lower than the power consumption of the organic light emitting display panel, wherein the master controller is connected to the organic light emitting display panel, the slave controller is connected to the LCD panel, wherein the master controller is configured to, in the operating state, control the organic light emitting display panel to display, and the slave controller is configured to, in the operating state, control the LCD panel to display.

3. The display device according to claim 2, wherein the display module further comprises a touch screen, the touch screen is arranged on a same side with the light emitting surface of the LCD panel and is connected to the master controller, wherein the touch screen is used to acquire touch-position information and send the touch-position information to the master controller.

4. The display device according to claim 2, wherein the master controller is connected to the slave controller, wherein the master controller is configured to trigger the slave controller to enter the operating state when the master controller switches from the operating state to a hibernating state, and to trigger the slave controller to enter the hibernating state when the master controller switches from the hibernating state to the operating state.

5. The display device according to claim 2, wherein a master operating system runs on the master controller and a slave operating system runs on the slave controller, and wherein a power consumption of the slave operating system is lower than a power consumption of the master operating system.

6. The display device according to claim 1, wherein the metal layer is a metal cathode.

7. The display device of claim 1, wherein the master controller and the slave controller are separated from each other.

8. An electronic device, comprising a display device, wherein the display device comprises:
a display module, which comprises at least two display panels; and
at least two controllers, each of which is connected to a respective one of the at least two display panels and configured to, in an operating state, control the respective one of the at least two display panels to display, wherein the at least two display panels comprise an organic light emitting display panel and a liquid crystal display (LCD) panel, the LCD panel has a light emitting surface and a back surface opposite to the light emitting surface, the organic light emitting display panel has a light emitting surface facing the back surface of the LCD panel, wherein the organic light emitting display panel comprises a first substrate and organic light emitting structures on the first substrate, and each of the organic light emitting structures comprises a hole transport layer, an organic emissive layer, an electron transport layer and a metal layer, wherein the LCD panel comprises a second substrate, a crystal layer and a third substrate, and the metal layer of the organic light emitting display panel is between the crystal layer and the organic emissive layer, wherein ambient light passing through the LCD panel is reflected back to the LCD panel by the metal layer when the LCD is displaying, wherein the at least two controllers comprise a master controller and a slave controller, and the display device further comprises a temperature sensor connected to the master controller, wherein the temperature sensor is used to detect an environmental temperature and send the environmental temperature to the master controller, and the master controller cooperates with the slave controller to control the time-division display of the organic light emitting display panel and the LCD panel based on the environmental temperature, wherein a switch time between the organic light emitting display panel and the LCD panel at a higher environmental temperature is shorter than a switch time between the organic light emitting display panel and the LCD panel at a lower environmental temperature.

9. The electronic device according to claim 8, wherein the power consumption of the LCD panel is lower than the power consumption of the organic light emitting display panel, wherein the at least two controllers comprises a master controller and a slave controller, wherein the master controller is connected to the organic light emitting display panel, the slave controller is connected to the LCD panel, wherein the master controller is configured to, in the operating state, control the organic light emitting display panel to display, and the slave controller is configured to, in the operating state, control the LCD panel to display.

10. The electronic device according to claim 9, wherein the display module further comprises a touch screen, the touch screen is arranged on a same side with the light emitting surface of the LCD panel and is connected to the master controller, wherein the touch screen is used to acquire touch-position information and send the touch-position information to the master controller.

11. The electronic device according to claim 9, wherein the master controller is connected to the slave controller, wherein the master controller is configured to trigger the slave controller to enter the operating state when the master controller switches from the operating state to a hibernating state, and to trigger the slave controller to enter the hibernating state when the master controller switches from the hibernating state to the operating state.

12. The electronic device according to claim 9, wherein a master operating system runs on the master controller and a slave operating system runs on the slave controller, and wherein a power consumption of the slave operating system is lower than a power consumption of the master operating system.

13. The electronic device according to claim 8, wherein the metal layer is a metal cathode.

14. The electronic device of claim 8, wherein the master controller and the slave controller are separated from each other.

15. A method for controlling a display device, wherein the display device comprises: an organic light emitting display panel, a liquid crystal display (LCD) panel, a temperature sensor, a master controller connected to the organic light emitting display panel and a slave controller connected to the LCD panel, wherein LCD panel has a light emitting surface and a back surface opposite to the light emitting surface, the organic light emitting display panel has a light emitting surface facing the back surface of the LCD panel, wherein the organic light emitting display panel comprises a first substrate and organic light emitting structures on the first substrate, the LCD panel comprises a second substrate, a crystal layer and a third substrate, each of the organic light emitting structures comprises a hole transport layer, an organic emissive layer, an electron transport layer and a metal layer, and the metal layer is between the organic emissive layer and the crystal layer, and ambient light passing through the LCD panel is reflected back to the LCD panel by the metal layer when the LCD is displaying, wherein the temperature sensor is used to detect an environmental temperature and send the environmental temperature to the master controller, the master controller cooperates with the slave controller to control the time-division display of the organic light emitting display panel and the LCD panel based on the environmental temperature, the method comprising:
the master controller sending a screen turn-off instruction to the organic light emitting display panel and triggering the slave controller to switch from a hibernating state to an operating state when the master controller switches from an operating state to an hibernating state;
the master controller sending a screen turn-on instruction to the organic light emitting display panel and triggering the slave controller to switch from the operating state to the hibernating state when the master controller switches from the hibernating state to the operating state;
wherein the slave controller sends a screen turn-on instruction to the LCD display panel when the slave controller switches from the hibernating state to the operating state, and the slave controller sends a screen turn-off instruction to the LCD display panel when the slave controller switches from the operating state to the hibernating state,
wherein a switch time between the organic light emitting display panel and the LCD panel at a higher environmental temperature is shorter than a switch time between the organic light emitting display panel and the LCD panel at a lower environmental temperature.

16. The method according to claim 15, wherein after the master controller triggers the slave controller to switch to the operating state, the method further comprises:
the master controller sending basis information to be displayed to the slave controller, wherein the basis information to be displayed is information to be displayed by the LCD display panel in the control of the slave controller after the slave controller switches to the operating state,
wherein the basic information to be displayed comprises at least one of the followings: system time, system date, or data on vital signs.

17. The method according to claim 16, further comprising:
the master controller switching from the hibernating state to the operating state when the master controller in the hibernating state receives touch-position information from a touch screen.

18. The method according to claim 15, further comprising:
the master controller switching from the hibernating state to the operating state when the master controller in the hibernating state receives touch-position information from a touch screen.

19. The method of claim 15, wherein a master operating system runs on the master controller and a slave operating system runs on the slave controller, and wherein a power consumption of the slave operating system is lower than a power consumption of the master operating system.

* * * * *